United States Patent
Mehrhoff et al.

(10) Patent No.: US 10,641,803 B2
(45) Date of Patent: May 5, 2020

(54) SYSTEMS ARCHITECTURE FOR CONTROLLING ONSITE AND OFFSITE ENERGY SOURCES

(71) Applicant: MASTERCARD INTERNATIONAL INCORPORATED, Purchase, NY (US)

(72) Inventors: Shawn Mehrhoff, Saint Ann, MO (US); Christopher T. Scholl, Saint Peters, MO (US)

(73) Assignee: Mastercard International Incorporated, Purchase, NY (US)

( * ) Notice: Subject to any disclaimer, the term of this patent is extended or adjusted under 35 U.S.C. 154(b) by 241 days.

(21) Appl. No.: 15/807,326

(22) Filed: Nov. 8, 2017

(65) Prior Publication Data

US 2019/0137553 A1    May 9, 2019

(51) Int. Cl.
*G01R 22/10* (2006.01)
*G01R 22/06* (2006.01)
*G06F 17/40* (2006.01)
*G06F 13/38* (2006.01)

(52) U.S. Cl.
CPC ........... *G01R 22/10* (2013.01); *G01R 22/063* (2013.01); *G06F 13/38* (2013.01); *G06F 17/40* (2013.01)

(58) Field of Classification Search
CPC ....... G01R 22/063; G01R 22/10; G06F 13/38; G06F 17/40
USPC ..... 702/61; 700/287, 291, 293, 297; 705/34, 705/412
See application file for complete search history.

(56) References Cited

U.S. PATENT DOCUMENTS

| | | | |
|---|---|---|---|
| 8,266,076 B2 | 9/2012 | Lopez et al. | |
| 8,412,643 B2 | 4/2013 | Lopez et al. | |
| 8,849,471 B2 | 9/2014 | Daniel et al. | |
| 10,282,687 B2 * | 5/2019 | Parvania | G05F 1/66 |
| 2007/0219932 A1 | 9/2007 | Carroll et al. | |
| 2009/0055300 A1 | 2/2009 | McDowell | |
| 2009/0228405 A1 | 9/2009 | Lopez et al. | |
| 2012/0053739 A1 | 3/2012 | Brian et al. | |
| 2012/0065791 A1 | 3/2012 | Besore et al. | |
| 2013/0304275 A1 | 11/2013 | Lee et al. | |
| 2015/0154618 A1 | 6/2015 | Forbes, Jr. | |

FOREIGN PATENT DOCUMENTS

EP    2856187 B1 *   4/2016   ......... G01R 31/3648

\* cited by examiner

*Primary Examiner* — John H Le
(74) *Attorney, Agent, or Firm* — Armstrong Teasdale LLP

(57) ABSTRACT

A power calculating (PC) computing device including a processor and a memory in communication with the processor, the processor programmed to retrieve power supply data from a renewable energy device, wherein the power supply data includes at least one measurement associated with renewable power generation, retrieve power status data from an accumulator, retrieve power demand data from a power monitor device associated with an electrical device, retrieve utility status data from a utility data provider, generate aggregate power data based on the power supply data, the power status data, and the power demand data, and calculate a power cost metric based on the aggregate power data and the utility status data.

21 Claims, 6 Drawing Sheets

SYSTEMS ARCHITECTURE FOR CONTROLLING ONSITE AND OFFSITE ENERGY SOURCES

BACKGROUND

The field of the present disclosure relates generally to consumer energy sources, and more specifically, to network-based systems and methods for controlling and analyzing consumer energy sources.

Renewable energy has been increasingly used to power properties such as homes and offices. Users have been more and more drawn to cheaper and greener renewable energy sources as an alternative to conventional energy. For example, one form of renewable energy includes installing solar panels to a property's electric grid. Currently, users may connect renewable energy devices through their distribution board to their homes to help supply power to their home. When too much power is being produced, users may either store it or send it back through a conventional supplier's power grid. Along with the cost efficiency of renewable energy, some conventional energy suppliers allow users to sell their energy to the suppliers when users' renewable energy devices are producing too much power. Unfortunately, it is difficult for users to keep track of earnings, savings, and costs due to all the different and separate steps involved. This is further complicated when a user's renewable energy device may not produce enough energy to power their home, creating a need for the user to purchase energy from a conventional supplier. Additionally, users may also have difficulty accurately keeping track of and controlling the electrical draw from their home devices to keep the need to purchase more energy down. Consequently, due to all of these complications, most users are not saving as much money as they could be, which is one of the main reasons users switch to renewable energy to begin with.

Accordingly, there is a need to have a streamlined way to track and control the energy usage in users' property (e.g., household, office), and to calculate the savings from using renewable energy and the possible cost of purchasing conventional energy. Power calculations and control methods are described herein that make use of APIs to generate real-time savings and power metrics from using solar power and allow immediate control of power consuming devices in a user's property.

BRIEF DESCRIPTION

In one aspect, a power calculating (PC) device is provided. The PC device includes a processor and a memory in communication with the processor. The processor is programmed to retrieve power supply data from a renewable energy device wherein the power supply data includes at least one measurement associated with renewable power generation, retrieve power status data from an accumulator, retrieve power demand data from a power monitor device associated with a consumer electrical device, retrieve utility status data from a utility data provider, generate aggregate power data based on the power supply data, the power status data, and the power demand data, and calculate a power cost metric based on the aggregate power data and the utility status data.

In another aspect, a method for calculating energy consumption is provided. The method is implemented in a power calculating (PC) computing device including a processor and a memory. The method includes retrieving power supply data from a renewable energy device wherein the power supply data includes at least one measurement associated with renewable power generation, retrieving power status data from an accumulator, retrieving power demand data from a power monitor device associated with a consumer electrical device, retrieving utility status data from a utility data provider, generating aggregate power data based on the power supply data, the power status data, and the power demand data, and calculating a power cost metric based on the aggregate power data and the utility status data.

In another aspect, a non-transitory computer readable medium that includes computer executable instructions for calculating energy consumption is provided. When executed by a power calculating (PC) device having a processor and a memory, the computer executable instructions cause the PC device to retrieve power supply data from a renewable energy device wherein the power supply data includes at least one measurement associated with renewable power generation, retrieve power status data from an accumulator, retrieve power demand data from a power monitor device associated with a consumer electrical device, retrieve utility status data from a utility data provider, generate aggregate power data based on the power supply data, the power status data, and the power demand data, and calculate a power cost metric based on the aggregate power data and the utility status data.

BRIEF DESCRIPTION OF THE DRAWINGS

FIG. 1 is a block diagram of an example power system for control and analysis of consumer energy sources.

FIG. 2 is a data network message flowchart illustrating an example implementation of the power system shown in FIG. 1.

FIG. 3 is a power network flowchart illustrating an example implementation of the power system shown in FIG. 1.

FIG. 4 illustrates an example configuration of a user computer device that may be used with the power system shown in FIG. 1.

FIG. 5 illustrates an example configuration of a server computer device that may be used with the power system shown in FIG. 1.

FIG. 6 is a flowchart illustrating an example process of the power system of FIG. 1.

DETAILED DESCRIPTION

Figure 1:
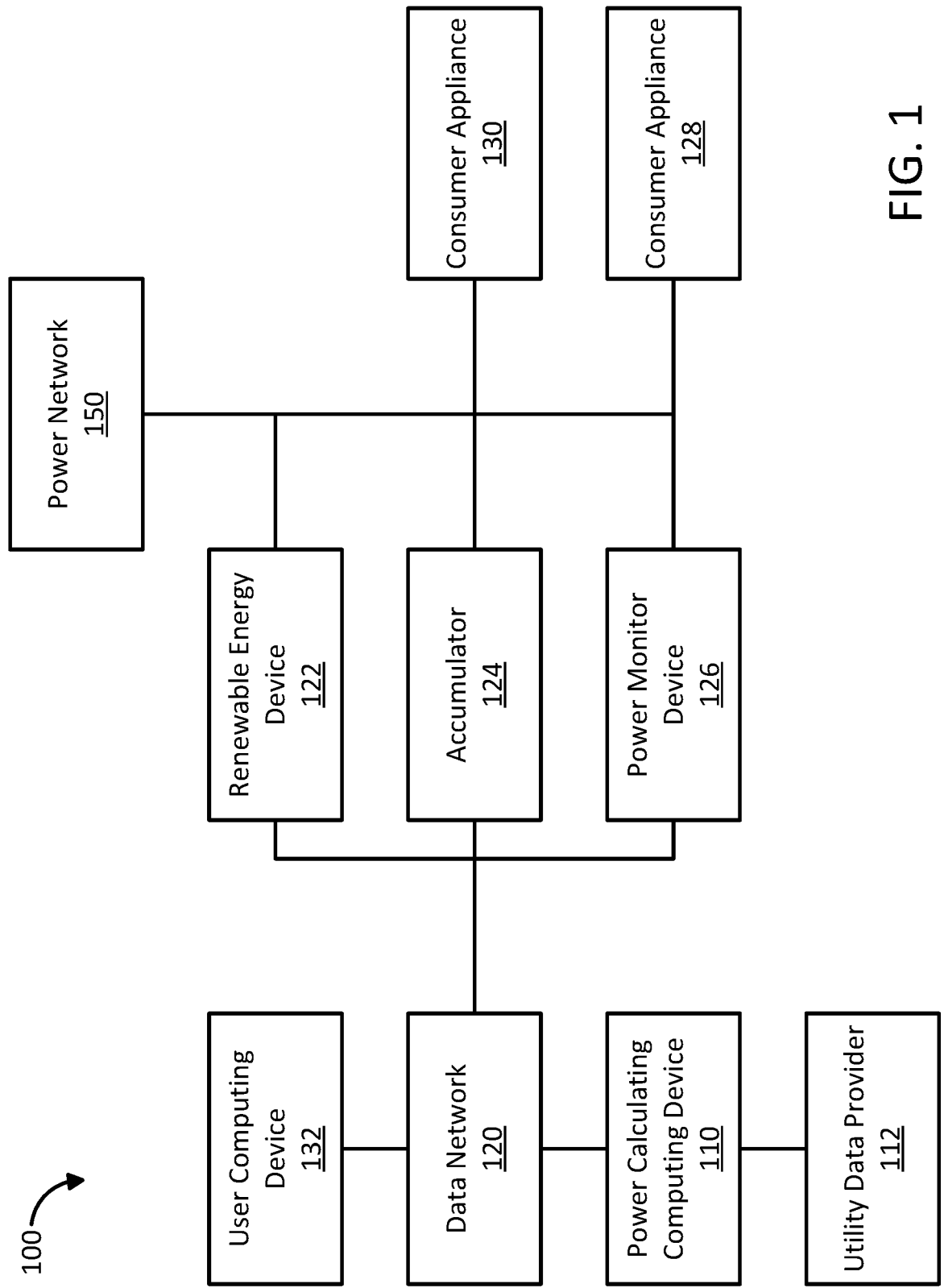
FIGS. 1-6 show example embodiments of the methods and system described herein.

The following detailed description illustrates embodiments of the disclosure by way of example and not by way of limitation. The description enables one skilled in the art to make and use the disclosure, describes several embodiments, adaptations, variations, alternatives, and uses of the disclosure including what is presently believed to be the best mode of carrying out the disclosure.

The systems of the methods of the disclosure allow analysis and control of energy distribution between onsite and offsite sources. Such analysis and control may be especially desirable for a user associated with a property having volatile energy usage, leading to unpredictable utility costs.

The benefits of photovoltaic power systems to real estate property owners are increasingly recognized as the costs of obtaining and installing photovoltaic power systems continues to fall. Photovoltaic solar panels may be used in an array, or in some embodiments a single solar panel may be provided. Solar panels may be mounted on rooftops or another suitable location on a property, with each solar panel provided including solar modules or solar cells that convert light energy from the sun to electricity according to well-known photovoltaic principles and effect. In the case of multiple solar panels, the electricity produced by each solar panel may be combined and may be used to power electrical loads of a residence or business. Photovoltaic power systems confer an ability for property owners to disconnect from the power grid and avoid payments, or otherwise reduce payments, to a third party electrical power provider such as a conventional electric company. Over time, such cost savings may exceed the costs of obtaining and installing a photovoltaic power system, and as the cost of photovoltaic power systems continues to fall, property owners may recoup their costs in a shorter period of time.

Further, in instances wherein a photovoltaic power system generates more power than needed by the residence or business, the excess electrical energy may be "sold" by providing energy generated by the photovoltaic power system to the power grid for use by other consumers. In exchange for the excess energy supplied back to the power grid, the property owner may receive a credit from the electric company or other utility or entity operating the power grid. Such credit may be deducted from the property owner's account with the electric company. In some cases, certain property owners may enjoy a net zeroing of their electrical power bills via the combination lower power bills from reduced consumption of power from the third party power company and credits from the third party power company for the excess energy supplied to the grid by their photovoltaic power systems.

At present, however, there is significant latency between power consumption and the calculation of energy costs associated with onsite and offsite distribution. For example, short-term weather changes may have significant effects on power consumption and generation. The impact to energy consumption and generation may be prompt; however the impact to energy costs may be limited to traditional accounting cycles. This delay may result in unpredictable energy costs and underutilization of energy resources, such as renewable energy generated on site.

In one example, a home is in a geographically remote area with high energy utility costs (e.g., off-site sources). The home is further equipped with solar panels and batteries (e.g., on-site sources). Fluctuations in solar generation and stored energy may trigger energy draw from the utility, resulting in elevated energy costs. However, the exact cost of the off-site energy usage may be difficult to calculate due to varying utility rates, potential energy credits (e.g., net zeroing), and the exact amount of offsite energy utilized. Oftentimes, energy billing occurs significantly after consumption, minimizing the ability to manage the distribution of onsite and offsite energy sources.

Advantageously, the systems and method of the disclosure provide for analysis and control of onsite (e.g., solar, geothermal) and offsite (e.g., energy utility) power generation and distribution. Specifically, power costs may be calculated based on near real time energy data, such as power supply data, power storage data, power demand data, and utility (e.g., cost) data, as opposed to on set billing intervals. For example, onsite generation may be monitored against power consumption, to determine energy draws from offsite providers, such as electric utilities.

The systems and methods of the disclosure provide for notifications based on power cost metrics. In one embodiment, a notification may be generated after a specific value of offsite energy has been consumed, providing a user the ability to make energy decisions at the time of consumption. For example, onsite energy production may be decreased due to weather conditions while heating costs may be similarly increased, and then a notification may be transmitted to a user device indicating $100 of offsite energy has been consumed. Alternatively, in known systems, the indication of increased offsite energy costs may be delayed to a predetermined billing cycle. In certain embodiments, the systems and methods of the disclosure provide for controlling power consumption and/or generation. For example, the notification may further include a command to reduce heating to minimize the costs associated with offsite energy.

In one aspect, a power calculating (PC) device is provided. The PC device is used to keep track of the use of electricity in the user's property (e.g., household, office, warehouse) by collecting data from various points of an electrical grid, displaying this data to the user, and calculating further data based on the collected data.

The PC device is configured to retrieve power supply data from a connected renewable energy device, retrieve power status data from an accumulator, and retrieve power demand data from energy consuming electrical devices. The PC device generates aggregated power data, which it will display in the form of calculations to users. The PC device is configured to monitor and control the electricity flow to the energy consuming electrical devices.

The PC device retrieves power supply data generated by a connected renewable energy device. Power supply data includes how much power is being generated, how much power each renewable energy device is generating, and changes in how much power is being generated. A renewable energy device includes solar panels, wind turbines, watermills, thermoelectric generators, and any other renewable energy devices or systems. The renewable energy device is configured to gather energy from a renewable resource and convert that energy into electrical power. Renewable resources include, for example, geothermal, hydropower, solar energy, biofuel, and wind power. For example, a solar panel may generate 275 watts of electricity over an hour.

The PC device is configured to retrieve power status data generated by an accumulator. Power status data includes how much power is being stored in the accumulator, how much power is being received from the accumulator, and how much power is being put into the accumulator. An accumulator may include energy storage devices, specifically rechargeable batteries, supercapacitors, and UltraBatteries. For example, a battery could be charged to 75%, allowing it to store more power should the need arise.

The PC device retrieves power demand data from connected consumer electrical devices. Consumer electrical devices includes consumer electronics, consumer appliances, lighting, HVAC systems, and the like. For example, consumer electrical devices may include refrigerators, freezers, air conditioners, space heaters, televisions, computers, and the like. Power demand data includes an indication of whether an energy consuming electrical device is drawing power, how much an energy consuming electrical device is drawing, and changes to how much an energy consuming electrical device is drawing. An energy consuming electrical device includes any electrically powered device that is directly connected to the property electrical system, for example lights or an electric garage door, and any electrically powered device that is indirectly connected to the property electrical system, namely anything that connects to an electrical outlet.

In some embodiments, the PC device is configured to retrieve power supply data, power status data, and power demand data using an application programming interface (API). In one embodiment, the API may collect data from the renewable energy device, the accumulator, and/or the energy consuming electrical device by transmitting a HTTP request over a data network. In another embodiment, the PC device is configured to retrieve data using Message Queue Telemetry Transport ("MQTT"), by querying a channel associated with any combination of renewable energy devices, accumulators, and energy consuming electrical devices. For example, the PC device may query a MQTT channel associated with energy consumption including messages associated electrical devices.

In certain embodiments, the PC device queries a power distribution board associated with a property power network, including any combination of power electronics devices (e.g., accumulators, energy sources, consumer appliances). The distribution board includes a group of electrical switches and circuit breakers. In one embodiment, the distribution board includes a plurality of smart circuit breakers measuring power consumption associated with circuits within a home or office. For example, a smart circuit breaker may measure the power consumption associated with a specific circuit, such as a heating system or specific room. In at least one aspect, the smart circuit breaker includes a power monitor device.

The PC device receives data from the renewable energy device, the accumulator, and the energy consuming electrical devices by linking to the distribution board through an API. In one embodiment, The API connection to the distribution board includes a direct connection, where the API directly connects to the switches (e.g., smart circuit breakers) in the distribution board. Additionally or alternatively, the API connection includes an indirect connection, where the API connects to a separate device that links to the distribution board's incoming and outgoing electrical lines. For example, a power monitor device such as a smart plug may be connected to the power network. In one embodiment, the PC device may make an API call to the distribution board configured to generate an API response including power status data, power supply data, and power demand data.

In some embodiments, the PC device is configured to determine individual power demand data associated with energy electrical devices, based on power demand data. The individual power demand data may be shown on levels including an individual appliance level, an outlet level, or a room level. The individual power demand data shown may be shown in kilowatts or as a percentage of the power supply data and the power status data. In certain embodiments, the individual power demand data retrieved from an online database containing data about the energy consuming electrical device or from the user manually entering power draw data. For example, PC device may query a data source to retrieve data including an energy consumption rate for consumer appliances such as a refrigerator and television.

In some embodiments, the PC device generates aggregated power data. The aggregated power data is based on the power supply data, the power status data, and the power demand data gathered from the connected renewable energy source, the accumulator, and the connected energy consuming electrical devices.

In some embodiments, the PC device generates aggregated power data in real time. The PC device may retrieve aggregated power data from a direct or indirect connection of the separate device to the distribution board. The aggregated power data may be generated individually as the power supply data, the power status data, and the power demand data. The aggregated power data may be generated jointly as showing how much of the power supplied by the renewable energy device is being drawn by the connected energy consuming electrical devices, how much of the power generated by the renewable energy device is being stored in the accumulator, and how much power is being drawn from the accumulator by the energy consuming electrical devices.

In some embodiments, the PC device computes a source comparison. A source comparison includes a direct comparison, which calculates the cost using the renewable energy device to real-time updated costs of conventional suppliers, and a set comparison, which compares the cost using the renewable energy device to the pre-loaded costs of conventional suppliers. A conventional supplier may be a source of conventional energy. The payment comparison is computed by using the aggregated power data collected. The payment comparison includes subtracting the cost of the aggregated power data from the cost of the same data if it was gained using conventional energy to gain a single number amount, graphically showing the difference in costs of the aggregated power data using the renewable energy device and conventional energy, and as a set ratio between the cost using the renewable energy device and the costs using conventional energy sources. In one embodiment, an amount of conventional energy purchased, if any, is also subtracted from the comparison to offset overdraw of energy consuming electrical devices. The payment comparison may be displayed to the user in real-time, weekly, monthly, and yearly.

In one example embodiment, the aggregated power data includes a source comparison and a payment comparison based on the power demand data. For example, the aggregated power data may include a cost statistic indicating the value of energy used for a utility provider and a savings cost statistic indicating the savings associated using power generated by a renewable energy device. In certain embodiments, the aggregated power data may include a source comparison indicating the possible cost savings if renewable energy had been used, such as if an additional renewable energy device was added to the power network. The aggregated power data may further include an energy breakdown, including percentages of energy used based on the power demand data. For example, the aggregated power data may indicate 30% of consumed power was associated with a distribution circuit labeled "bedroom" and 40% of consumed power was associated with a power monitor device integrated into a heating unit.

In some embodiments, the PC device is configured to transmit informational notifications, based on aggregated power data. Informational notifications may include alerts when the user is out of power, when the connected energy consuming electrical devices need to retrieve power from the accumulator, and when an outlet or energy consuming electrical device is overdrawing power. The user is able to interact with the informational notifications to be able to decrease power flow to an energy consuming electrical device, completely stop power flow to an energy consuming electrical device, and purchase more power from a conventional supplier.

In some embodiments, the PC device is configured to store power rules and further to generate notifications based on power rules including notification thresholds. In one embodiment, a power rule includes a notification threshold and a device identifier (e.g., phone number, email address).

For example, the PC device may compare a power rule to the aggregated power data, determine the aggregated power data satisfies the power rule, and generate a notification based on the device identifier.

In one embodiment, the notification may include a message that the energy stored in the accumulator has been exhausted, and energy is being pulled from a utility power source. In another embodiment, the notification may include a cost statistic indicating the value of electricity used within the past 24 hours, accounting for savings associated with renewable energy devices. In yet another embodiment, the notification may include an indication the value and/or amount of energy consumed has exceed a preset threshold.

In some embodiments, where the PC device stores power rules, the PC device generates power control instructions. Power control instructions include instructions configured to control if power is sent from the renewable energy device and/or accumulator to the individual energy consuming electrical devices. In one embodiment, power rules further include power control instructions, and the PC device is configured to transmit the power control instructions based on a notification threshold included in the power rule. For example, when the PC device determines aggregated power data satisfies a notification threshold in a power rule, the PC device may further transmit a notification to a user device and transmit power control instructions to a power device (e.g., consumer appliance, accumulator), such that the power control instructions may include instructions to limit the operation of an electrical device. Additionally or alternatively, the power control instructions may include instructions to enable the operation of a power device (e.g., consumer appliance, accumulator).

In one embodiment, the power control instructions are configured to enable and/or disable distribution board switches, such that individual devices and/or groups of devices may be enabled and/or disabled. For example, the power control instructions may include disabling a distribution board switch associated with an air conditioning unit, such that power consumption is decreased. Additionally or alternatively, power control instructions may be transmitted to electrical devices. For example, power control instructions may be transmitted to a control device associated with an air conditioning unit using an API.

In some embodiments, the power calculation device is configured to generate power purchase instructions. Power purchase instructions include purchasing conventional power through a conventional supplier. The PC device receives cost data from the conventional supplier, and transmits the data to the user. The user purchases power by connecting the PC device to a mobile banking application or site and completing the transaction. Mobile banking applications or sites include services provided by banks that allow users to process transactions on smartphones, tablets, and computers. Transactions may be completed on a by-use basis, a daily basis, a weekly basis, a monthly basis, and a yearly basis.

The methods and systems described herein may be implemented using computer programming or engineering techniques including computer software, firmware, hardware or any combination or subset thereof, wherein the technical effects may be achieved by performing one of the following steps: (a) retrieve power supply data from a renewable energy device; (b) retrieve power status data from an accumulator; (c) retrieve power demand data from a power monitor device, the power demand data including a power demand rate; (d) retrieve utility status data from a utility data provider, the utility status data including a power cost rate; (e) generate aggregate power data based on the power supply data; and (0 calculate a power cost metric based on the aggregate power data and the utility status data.

The systems and methods described herein are configured to facilitate (a) determining a source comparison associating electrical devices with energy sources including renewable energy devices and utility energy providers; (b) generating cost statistics including costs and/or savings associated with renewable energy devices; (c) estimating cost savings associated with renewable energy devices; (d) generating notifications associated with power sources including renewable energy devices, utility energy providers, and accumulators; (e) generating notification associated with power consumption including power monitor devices and electrical devices; and (0 estimating costs associated with energy consumption from multiple energy sources including renewable energy devices.

Described herein are computer systems such as power calculating (PC) device. As described herein, all such computer systems include a processor and a memory.

Further, any processor in a computer device referred to herein may also refer to one or more processors wherein the processor may be in one computing device or a plurality of computing devices acting in parallel. Additionally, any memory in a computer device referred to herein may also refer to one or more memories wherein the memories may be in one computing device or a plurality of computing devices acting in parallel.

As used herein, a processor may include any programmable system including systems using micro-controllers, reduced instruction set circuits (RISC), application specific integrated circuits (ASICs), logic circuits, and any other circuit or processor capable of executing the functions described herein. The above examples are example only, and are thus not intended to limit in any way the definition and/or meaning of the term "processor."

As used herein, the term "database" may refer to either a body of data, a relational database management system (RDBMS), or to both. As used herein, a database may include any collection of data including hierarchical databases, relational databases, flat file databases, object-relational databases, object oriented databases, and any other structured collection of records or data that is stored in a computer system. The above examples are example only, and thus are not intended to limit in any way the definition and/or meaning of the term database. Examples of RDBMS's include, but are not limited to including, Oracle® Database, MySQL, IBM® DB2, Microsoft® SQL Server, Sybase®, and PostgreSQL. However, any database may be used that enables the systems and methods described herein. (Oracle is a registered trademark of Oracle Corporation, Redwood Shores, Calif.; IBM is a registered trademark of International Business Machines Corporation, Armonk, N.Y.; Microsoft is a registered trademark of Microsoft Corporation, Redmond, Wash.; and Sybase is a registered trademark of Sybase, Dublin, Calif.)

In one embodiment, a computer program is provided, and the program is embodied on a computer readable medium. In an example embodiment, the system is executed on a single computer system, without requiring a connection to a sever computer. In a further embodiment, the system is being run in a Windows® environment (Windows is a registered trademark of Microsoft Corporation, Redmond, Wash.). In yet another embodiment, the system is run on a mainframe environment and a UNIX® server environment (UNIX is a registered trademark of X/Open Company Limited located in Reading, Berkshire, United Kingdom).

The application is flexible and designed to run in various different environments without compromising any major functionality. In some embodiments, the system includes multiple components distributed among a plurality of computing devices. One or more components may be in the form of computer-executable instructions embodied in a computer-readable medium.

As used herein, an element or step recited in the singular and proceeded with the word "a" or "an" should be understood as not excluding plural elements or steps, unless such exclusion is explicitly recited. Furthermore, references to "example embodiment" or "one embodiment" of the present disclosure are not intended to be interpreted as excluding the existence of additional embodiments that also incorporate the recited features.

As used herein, the terms "software" and "firmware" are interchangeable, and include any computer program stored in memory for execution by a processor, including RAM memory, ROM memory, EPROM memory, EEPROM memory, and non-volatile RAM (NVRAM) memory. The above memory types are example only, and are thus not limiting as to the types of memory usable for storage of a computer program.

The systems and processes are not limited to the specific embodiments described herein. In addition, components of each system and each process may be practiced independent and separate from other components and processes described herein. Each component and process also may be used in combination with other assembly packages and processes.

The following detailed description illustrates embodiments of the disclosure by way of example and not by way of limitation. It is contemplated that the disclosure has general application to creating tunnels and/or connections between network segments using satellite routing.

FIG. 1 is a block diagram of an example power system 100 for control and analysis of consumer energy sources. System 100 includes data network 120 and power network 150. Data network 120 includes LAN networks, IP networks, Wi-Fi networks, and the like. Data network 120 includes power calculating (PC) computing device 110, user computing device 132, and utility data provider 112. PC device 110 is configured to retrieve utility status data from utility data provider 112, and transmit views and/or notification to user computing device 132.

Renewable energy device 122, accumulator 124, and power monitor device 126 are connected to both data network 120 and power network 150. PC device 110 is configured to retrieve data from renewable energy device 122, accumulator 124, and power monitor device 126. Renewable energy device 122 is configured to generate and supply energy to power network 150, and includes geothermal generators, wind generators, solar generators (e.g., solar panels), and the like. In certain embodiments, renewable energy device 122 is associated with power generation onsite at a property (e.g., household, office building), such as a wind generator or solar power supply. Accumulator 124 stores generated energy and provides energy to power network 150, and includes batteries, capacitors, steam accumulators, pumped-storage, and the like.

Power monitor device 126 calculates measurements of power network 150, including consumption rates, total usage, and the like. Power monitor device 126 includes an electricity meter (e.g., electromechanical meter, solid-state meter) measuring, at least, voltage and current (e.g., kilowatt hours) associated with power network 150, and a network interface associated with data network 120, such that measurements may be retrieved by the PC device 110. In one example, the power monitor device is integrated into a home electric meter. In some embodiments, any number of power monitor devices may be integrated into a breaker/distribution box, such that measurements may be associated with individual circuits within a home. In yet another embodiment, power monitor device 126 may be a smart plug and/or smart switch, generating measurements associated with a specific consumer appliance. For example, a consumer appliance (e.g., power monitor device 126) may be installed between the power supply of a consumer appliance (e.g., 130, 128) and power network 150. In certain embodiments, power monitor device 126 may be integrated into a consumer appliance. For example, a refrigerator may be configured to measure its electricity consumption. Consumer appliances 128 and 130 are connected to power network 150, and consume electricity. Consumer appliances include televisions, heaters, refrigerators, computers, toasters, lights, and the like.

Figure 2:
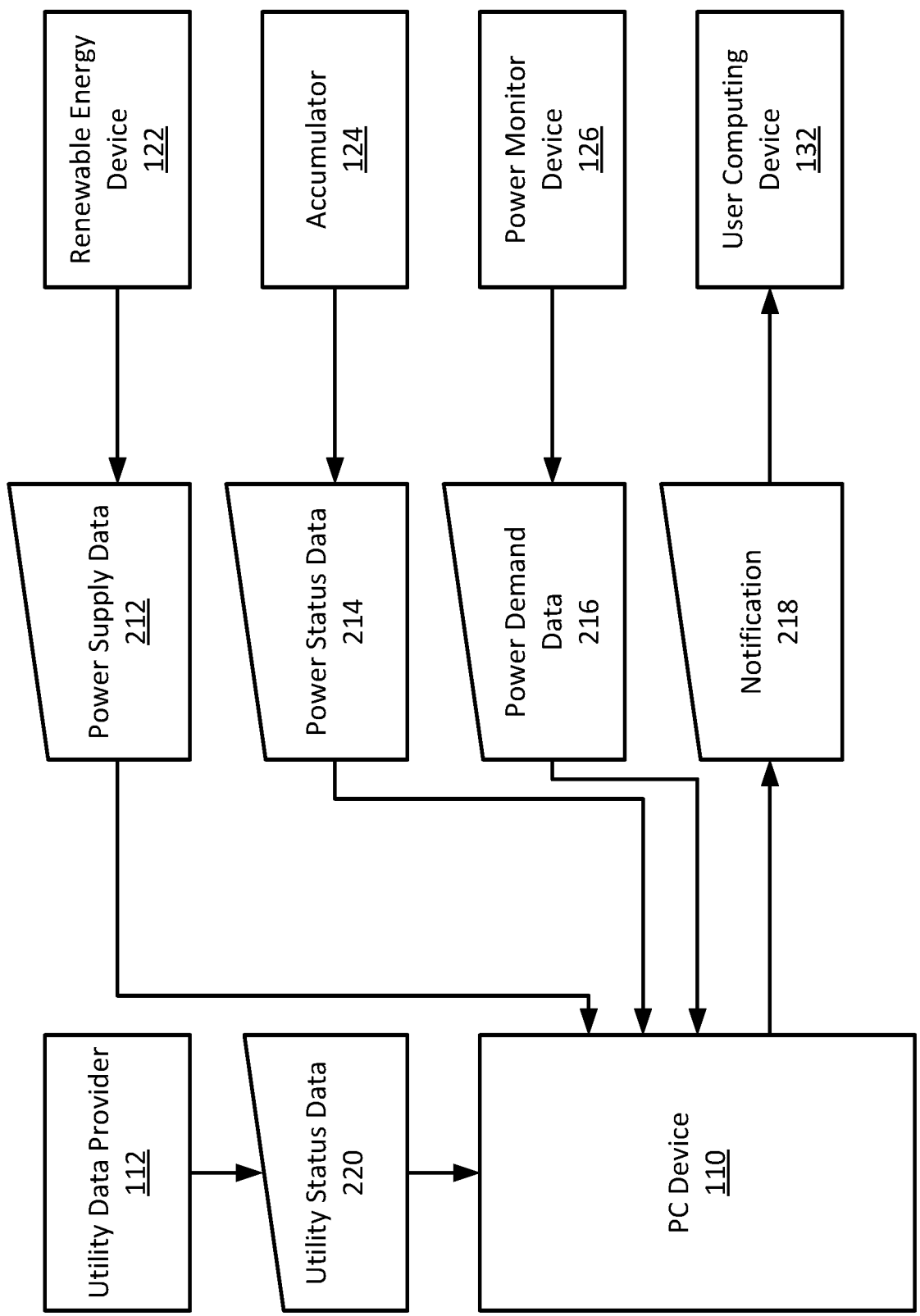

FIG. 2 is a data network message flowchart illustrating an example implementation of the power system shown in FIG. 1. Specifically, FIG. 2 illustrates data network 120. PC device 110 retrieves power supply data 212 from renewable energy device 122, including at least one power generation metric associated with renewable energy generation. In some embodiments, power supply data 212 includes a rate of energy being generated by a solar panel and/or a total of energy generated within the past 24 hours. For example, power supply data 212 may include a measurement of 200 kilowatt hours generated in the current day cycle, and a generation rate of 50 kilowatts. PC device 110 retrieves power status data 214 from accumulator 124 including a stored power measurement and a rate measurement. For example, power status data 214 may include an amount of energy stored by a battery, and a rate of charge/discharge associated with the battery.

PC device 110 is configured to retrieve power demand data 216 from power monitor device 126 including a power demand rate. Power demand data 216 may be associated with any number of consumer appliances (e.g., 128, 130, shown in FIG. 1). For example, power demand data 216 may include an energy consumption rate associated with a television, and an energy use total associated with a refrigerator.

PC device 110 retrieves utility status data 220 from utility data provider 112, including at least a power cost rate. In certain embodiments, utility status data 220 includes an XML file of a utility energy rate schedule for the next 24 hours, such as peak/off-peak hours and peak/off-peak rates. For example, utility status data 220 may include a power cost rate of $0.15 per kilowatt hour, and a peak surcharge of $0.05 per kilowatt hour during 3-6 pm. PC device 110 is configured to transmit notification 218 to user computing device 132, including a power cost metric. In certain embodiments, notification 218 is generated based on a rule stored by PC device 110. For example, notification 218 may include an indication that the cost of power consumed within the current day as exceeded a preset level.

Figure 3:
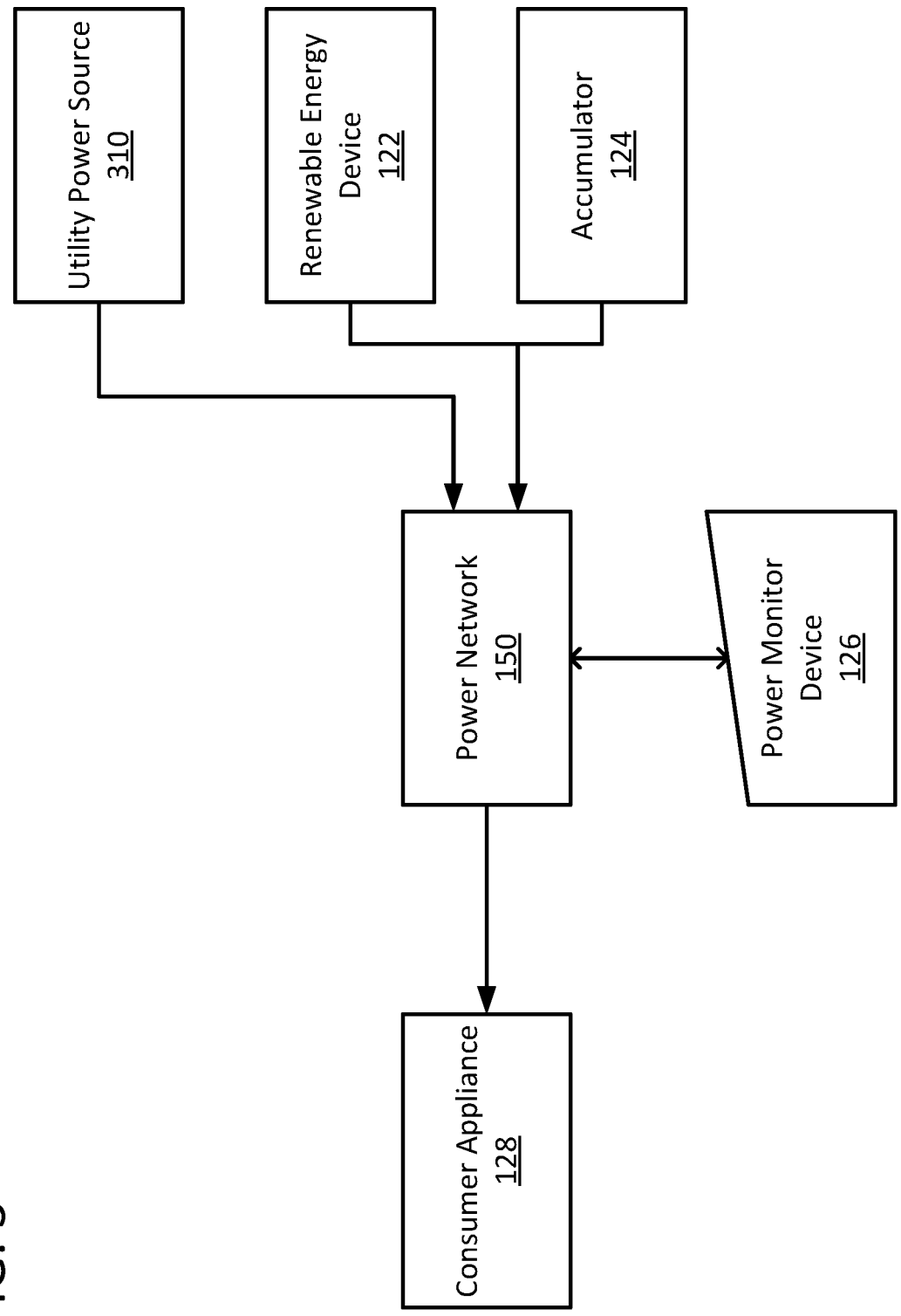

FIG. 3 is a power network flowchart illustrating an example implementation of the power system shown in FIG. 1. Specifically, FIG. 3 illustrates power network 150. In one embodiment, power network 150 is a utility power grid, providing power over a wide area. Additionally or alternatively, power network 150 is a local power circuit, providing power within a home or office building. Consumer appliance 128 consumes energy from power network 150. For example, consumer appliance 128 may include a refrigerator drawing power from a home electrical circuit to power the refrigerator's operations. Power network 150 is configured to receive power from, at least, renewable energy device 122. In the example embodiment, power network 150 includes accumulator (e.g., battery) 124 also powering power network 150. In some embodiments, power network 150 is coupled to a utility power grid. For example, power monitor device 126 is configured to monitor energy consumption and/or generation over power network 150.

In the example embodiment, power network 150 further includes utility power source 310, such as an area power grid. In certain embodiments, utility power source 310 is provided at a cost determined by an associated utility provider. For example, energy provided to power network 150 may be billed at a cost per kilowatt hour, as included in the utility status data 220 (shown in FIG. 2). Power monitor device 126 is configured to determine power demand data 216 (shown in FIG. 2) associated with consumer appliance 128, and, in certain embodiments, determine power status and/or power supply data associated with utility power source 310, renewable energy device 122, and accumulator 124. For example, power monitor device 126 may determine consumer appliance 128 has used 1.5 kilowatt hours of energy sourced from renewable energy device 122. In certain embodiments, energy may be transmitted to utility power source 310 from power network 150, such as excess energy generated by renewable energy device 122, in a buyback condition. In some embodiments, energy transmitted in a buyback condition may be considered an offset to costs associated with utility power source 310. For example, PC device 110 may adjust the costs associated with utility power source 310 based on buyback power.

Figure 4:
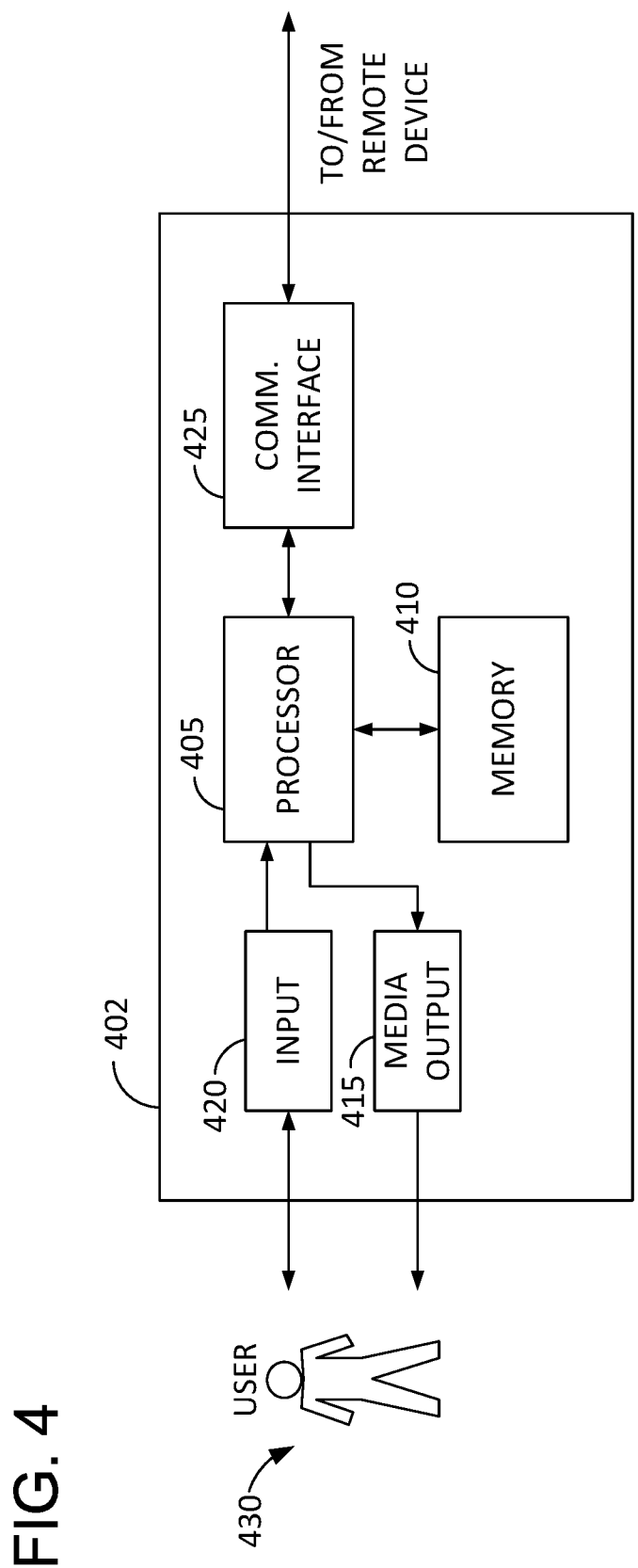

FIG. 4 depicts an exemplary configuration of a remote or user computing device 402, such as user computing device 132 (shown in FIG. 1). Computing device 402 may include a processor 405 for executing instructions. In some embodiments, executable instructions may be stored in a memory area 410. Processor 405 may include one or more processing units (e.g., in a multi-core configuration). Memory area 410 may be any device allowing data such as executable instructions and/or other data to be stored and retrieved. Memory area 410 may include one or more computer-readable media.

Computing device 402 may also include at least one media output component 415 for presenting data to a user 430. Media output component 415 may be any component capable of conveying data to user 430. In some embodiments, media output component 415 may include an output adapter, such as a video adapter and/or an audio adapter. An output adapter may be operatively coupled to processor 405 and operatively coupleable to an output device such as a display device (e.g., a liquid crystal display (LCD), organic light emitting diode (OLED) display, cathode ray tube (CRT), or "electronic ink" display) or an audio output device (e.g., a speaker or headphones). In some embodiments, media output component 415 may be configured to present an interactive user interface (e.g., a web browser or client application) to user 430.

In some embodiments, computing device 402 may include an input device 420 for receiving input from user 430. Input device 420 may include, for example, a keyboard, a pointing device, a mouse, a stylus, a touch sensitive panel (e.g., a touch pad or a touch screen), a camera, a gyroscope, an accelerometer, a position detector, and/or an audio input device. A single component such as a touch screen may function as both an output device of media output component 415 and input device 420.

Computing device 402 may also include a communication interface 425, which may be communicatively coupleable to a remote device. Communication interface 425 may include, for example, a wired or wireless network adapter or a wireless data transceiver for use with a mobile phone network (e.g., Global System for Mobile communications (GSM), 3G, 4G or Bluetooth) or other mobile data network (e.g., Worldwide Interoperability for Microwave Access (WIMAX)).

Stored in memory area 410 are, for example, computer-readable instructions for providing a user interface to user 430 via media output component 415 and, optionally, receiving and processing input from input device 420. A user interface may include, among other possibilities, a web browser and client application. Web browsers enable users 430 to display and interact with media and other data typically embedded on a web page or a website from a web server associated with a merchant. A client application allows users 430 to interact with a server application associated with, for example, a vendor or business. For example, a client application stored on user computing device 132 may enable user 430 to interact with PC device 110.

Figure 5:
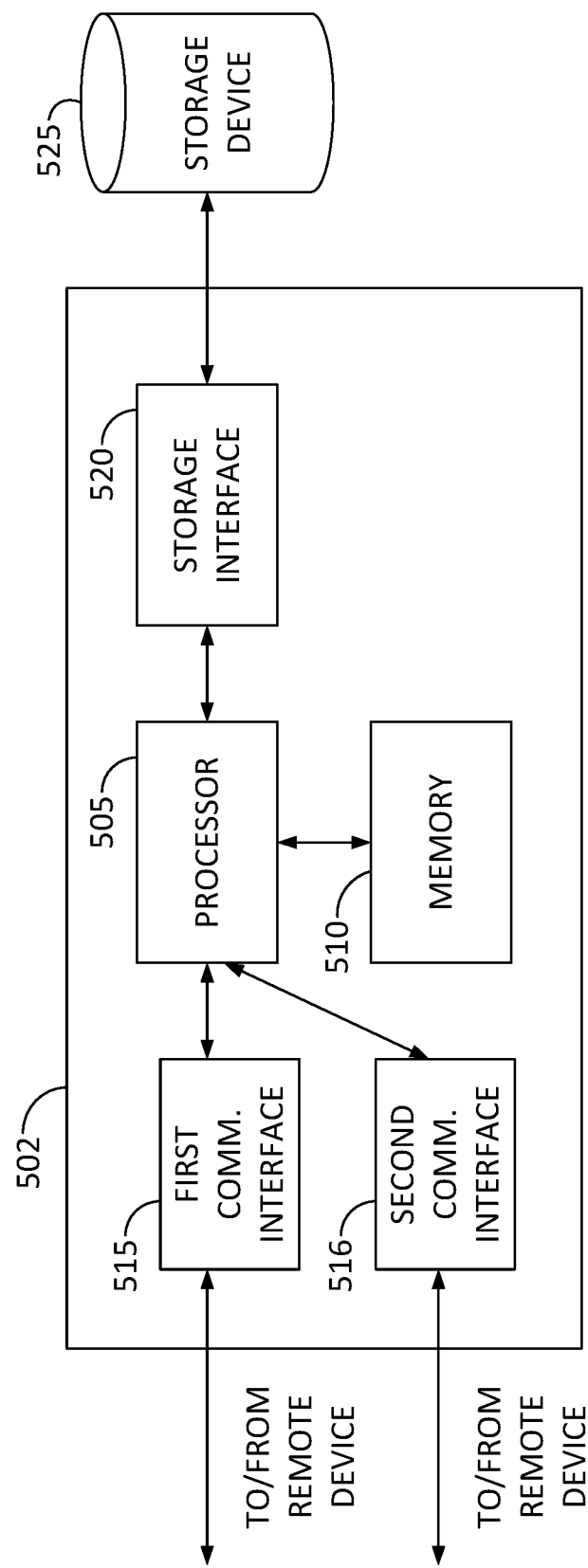

FIG. 5 depicts an exemplary configuration of a host computing device 502, such as PC device 110 (shown in FIG. 1). Host computing device 502 may include a processor 505 for executing instructions. Instructions may be stored in a memory area 510, for example. Processor 505 may include one or more processing units (e.g., in a multi-core configuration).

Processor 505 may be operatively coupled to a first communication (i.e., network) interface 515 and a second communication interface 516 such that host computing device 502 may be capable of communicating with a remote device such as computing device 402 shown in FIG. 4 or another host computing device 502. In some embodiments, communication interface 515 and/or communication interface 516 may be a virtual interface. In certain embodiments, communication interface 515 and/or communication interface 516 are associated with a network address, such as an IP address. In other embodiments, communication interface 515 and/or communication interface 516 are associated with physical network links. For example, communication interface 515 may receive network packets from a user computing device 402 via Ethernet, using a switching device.

Processor 505 may also be operatively coupled to a storage device 525. Storage device 525 may be any computer-operated hardware suitable for storing and/or retrieving data. In some embodiments, storage device 525 may be integrated in host computing device 502. For example, host computing device 502 may include one or more hard disk drives as storage device 525. In other embodiments, storage device 525 may be external to host computing device 502 and may be accessed by a plurality of host computing devices 502. For example, storage device 525 may include multiple storage units such as hard disks or solid state disks in a redundant array of inexpensive disks (RAID) configuration. Storage device 525 may include a storage area network (SAN) and/or a network attached storage (NAS) system.

In some embodiments, processor 505 may be operatively coupled to storage device 525 via a storage interface 520. Storage interface 520 may be any component capable of providing processor 505 with access to storage device 525. Storage interface 520 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing processor 405 with access to storage device 525.

Memory areas 410 (shown in FIG. 4) and 510 may include, but are not limited to, random access memory (RAM) such as dynamic RAM (DRAM) or static RAM (SRAM), read-only memory (ROM), erasable programmable read-only memory (EPROM), electrically erasable programmable read-only memory (EEPROM), and non-volatile RAM (NVRAM). The above memory types are example only, and are thus not limiting as to the types of memory usable for storage of a computer program.

Figure 6:
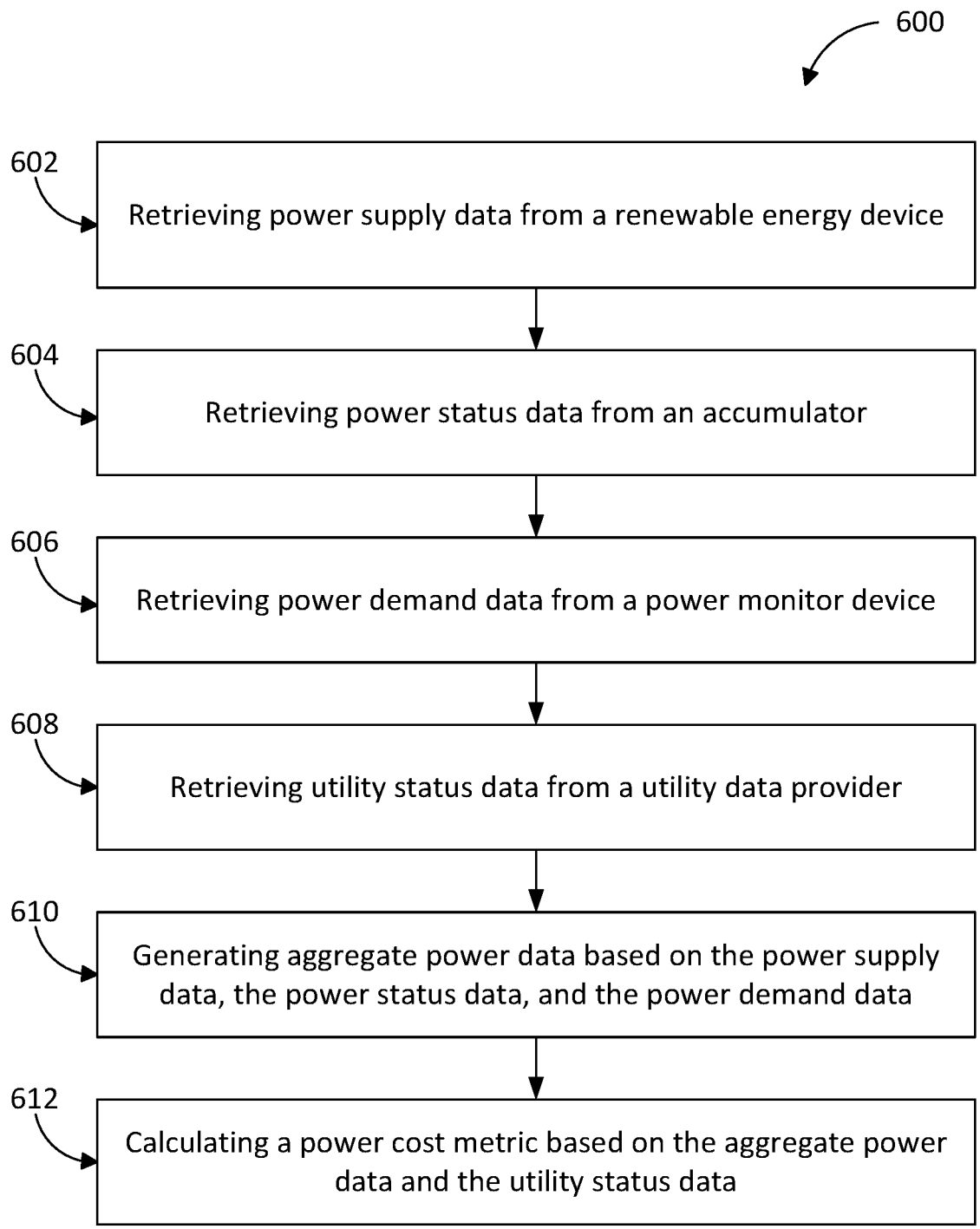

FIG. 6 is a flowchart illustrating an example process 600 of the power system of FIG. 1. Process 600 includes retrieving 602 power supply data from a renewable energy device, wherein the power supply data includes at least one measurement associated with renewable power generation; retrieving 604 power status data from an accumulator, wherein the power status data includes at least one storage measurement of accumulated power and at least one rate of change measurement of the accumulated power; retrieving 606 power demand data from a power monitor device, the power demand data including a power demand rate, wherein the power demand data is associated with at least one energy consuming consumer appliance; retrieving 608 utility status data from a utility data provider, the utility status data including a power cost rate, the utility status data retrieved based on the power demand data; generating 610 aggregate power data based on the power supply data, the power status data, and the power demand data; and calculating 612 a power cost metric based on the aggregate power data and the utility status data.

As will be appreciated based on the foregoing specification, the above-discussed embodiments of the disclosure may be implemented using computer programming or engineering techniques including computer software, firmware, hardware or any combination or subset thereof. Any such resulting computer program, having computer-readable and/or computer-executable instructions, may be embodied or provided within one or more computer-readable media, thereby making a computer program product, i.e., an article of manufacture, according to the discussed embodiments of the disclosure. These computer programs (also known as programs, software, software applications or code) include machine instructions for a programmable processor, and may be implemented in a high-level procedural and/or object-oriented programming language, and/or in assembly/machine language. As used herein, the terms "machine-readable medium," "computer-readable medium," and "computer-readable media" refer to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The "machine-readable medium," "computer-readable medium," and "computer-readable media," however, do not include transitory signals (i.e., they are "non-transitory"). The term "machine-readable signal" refers to any signal used to provide machine instructions and/or data to a programmable processor.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A power calculating (PC) computing device comprising a processor and a memory in communication with the processor, the processor programmed to:
   retrieve power supply data from a renewable energy device, wherein the power supply data includes at least one measurement associated with renewable power generation;
   retrieve power status data from an accumulator, wherein the power status data includes at least one storage measurement of accumulated power and at least one rate of change measurement of the accumulated power;
   retrieve power demand data from a power monitor device, the power demand data including a power demand rate, wherein the power demand data is associated with at least one energy consuming electrical device;
   retrieve, based on the power demand data, utility status data from a utility data provider, the utility status data including a power cost rate;
   generate aggregate power data based on the power supply data, the power status data, and the power demand data;
   determine a renewables cost associated with the aggregate power data, and a conventional cost associated with the aggregate power data and the retrieved utility status data; and
   calculate a power cost metric based on the renewables cost and the conventional cost.

2. The PC computing device of claim 1, wherein the power cost metric includes a calculated power cost associated with the at least one energy consuming electrical device.

3. The PC computing device of claim 1, wherein the processor is further programmed to:
   determine whether the calculated power cost metric matches a power rule stored in the memory, wherein the power rule includes a notification threshold and a device identifier; and
   transmit a user notification to a user computing device associated with the device identifier when the calculated power cost metric matches the power rule, the user notification including at least the power cost metric.

4. The PC computing device of claim 3, wherein the processor is further programmed to:
   generate a power control instruction based on the power rule and the power demand data, wherein the power control instruction is configured to limit the operation of at least one energy consuming electrical device; and
   transmit the power control instruction to the at least one energy consuming electrical device.

5. The PC computing device of claim 1, wherein retrieving power status data from the accumulator includes querying a MQTT channel associated with the accumulator.

6. The PC computing device of claim 1, wherein retrieving power demand data from the power monitor includes transmitting a HTTP API request to the power monitor.

7. The PC computing device of claim 1, wherein the power cost metric further includes a source comparison metric, based on the power supply data.

8. A computer-implemented method for calculating energy consumption, the method implemented using a power calculating (PC) computing device including a processor and a memory in communication with the processor, wherein the method comprises:

retrieving power supply data from a renewable energy device, wherein the power supply data includes at least one measurement associated with renewable power generation;

retrieving power status data from an accumulator, wherein the power status data includes at least one storage measurement of accumulated power and at least one rate of change measurement of the accumulated power;

retrieving power demand data from a power monitor device, the power demand data including a power demand rate, wherein the power demand data is associated with at least one energy consuming electrical device;

retrieving, based on the power demand data, utility status data from a utility data provider, the utility status data including a power cost rate;

generating, by the PC computing device, aggregate power data based on the power supply data, the power status data, and the power demand data;

determining a renewables cost associated with the aggregate power data, and a conventional cost associated with the aggregate power data and the retrieved utility status data; and calculating, by the PC computing device, a power cost metric based on the renewables cost and the conventional cost.

9. The method of claim 8, wherein the power cost metric includes a calculated power cost associated with the at least one energy consuming electrical device.

10. The method claim 8, further comprising:
determining whether the calculated power cost metric matches a power rule stored in the memory, wherein the power rule includes a notification threshold and a device identifier; and
transmitting, by the PC computing device, a user notification to a user computing device associated with the device identifier when the calculated power cost metric matches the power rule, the user notification including at least the power cost metric.

11. The method of claim 10, further comprising:
generating a power control instruction based on the power rule and the power demand data, wherein the power control instruction is configured to limit the operation of at least one energy consuming electrical device; and
transmitting the power control instruction to the at least one energy consuming electrical device.

12. The method of claim 8, wherein retrieving power status data from the accumulator includes querying a MQTT channel associated with the accumulator.

13. The method of claim 8, wherein retrieving power demand data from the power monitor includes transmitting a HTTP API request to the power monitor.

14. The method of claim 8, wherein the power cost metric further includes a source comparison metric, based on the power supply data.

15. A non-transitory computer readable medium that includes computer executable instructions for calculating energy consumption, wherein when executed by a power calculating (PC) device having a processor and a memory in communication with the processor, the computer executable instructions cause the PC device to:

retrieve power supply data from a renewable energy device, wherein the power supply data includes at least one measurement associated with renewable power generation;

retrieve power status data from an accumulator, wherein the power status data includes at least one storage measurement of accumulated power and at least one rate of change measurement of the accumulated power;

retrieve power demand data from a power monitor device, the power demand data including a power demand rate, wherein the power demand data is associated with at least one energy consuming electrical device;

retrieve, based on the power demand data, utility status data from a utility data provider, the utility status data including a power cost rate;

generate aggregate power data based on the power supply data, the power status data, and the power demand data;

determine a renewables cost associated with the aggregate power data, and a conventional cost associated with the aggregate power data and the retrieved utility status data; and calculate a power cost metric based on the renewables cost and the conventional cost.

16. The non-transitory computer readable medium of claim 15, wherein the power cost metric includes a calculated power cost associated with the at least one energy consuming electrical device.

17. The non-transitory computer readable medium of claim 15, the computer executable instructions further causing the PC computing device to:
determine whether the calculated power cost metric matches a power rule stored in the memory, wherein the power rule includes a notification threshold and a device identifier; and
transmit a user notification to a user computing device associated with the device identifier when the calculated power cost metric matches the power rule, the user notification including at least the power cost metric.

18. The non-transitory computer readable medium of claim 17, the computer executable instructions further causing the PC computing device to:
generate a power control instruction based on the power rule and the power demand data, wherein the power control instruction is configured to limit the operation of at least one energy consuming electrical device; and
transmit the power control instruction to the at least one energy consuming electrical device.

19. The non-transitory computer readable medium of claim 15, wherein retrieving power status data from the accumulator includes querying a MQTT channel associated with the accumulator.

20. The non-transitory computer readable medium of claim 15, wherein retrieving power demand data from the power monitor includes transmitting a HTTP API request to the power monitor.

21. The non-transitory computer readable medium of claim 15, wherein the power cost metric further includes a source comparison metric, based on the power supply data.

* * * * *